United States Patent
Scheucher

(10) Patent No.: US 9,620,456 B2
(45) Date of Patent: Apr. 11, 2017

(54) INTEGRATED CIRCUITS ON A WAFER AND METHODS FOR MANUFACTURING INTEGRATED CIRCUITS

(75) Inventor: Heimo Scheucher, Langegg (AT)

(73) Assignee: NXP B.V., Eindhoven (NL)

( * ) Notice: Subject to any disclaimer, the term of this patent is extended or adjusted under 35 U.S.C. 154(b) by 977 days.

(21) Appl. No.: 12/668,419

(22) PCT Filed: Jul. 10, 2008

(86) PCT No.: PCT/IB2008/052778
§ 371 (c)(1),
(2), (4) Date: Jan. 9, 2010

(87) PCT Pub. No.: WO2009/007929
PCT Pub. Date: Jan. 15, 2009

(65) Prior Publication Data
US 2010/0140748 A1    Jun. 10, 2010

(30) Foreign Application Priority Data
Jul. 12, 2007   (EP) ..................... 07112371

(51) Int. Cl.
H01L 23/58       (2006.01)
H01L 23/544      (2006.01)
H01L 21/66       (2006.01)
H01L 23/00       (2006.01)

(52) U.S. Cl.
CPC ............ *H01L 23/544* (2013.01); *H01L 22/34* (2013.01); *H01L 23/562* (2013.01); *H01L 23/585* (2013.01); *H01L 2223/5448* (2013.01); *H01L 2223/54426* (2013.01); *H01L 2223/54473* (2013.01); *H01L 2924/0002* (2013.01)

(58) Field of Classification Search
CPC ....... H01L 23/544; H01L 22/00; H01L 22/10; H01L 22/12; H01L 22/14; H01L 22/22; H01L 22/24; H01L 22/26; H01L 22/30; H01L 22/34; H01L 23/00; H01S 5/0014; H01S 5/0021; H01S 5/0028; H01S 5/0035; H01S 5/0042
USPC ..... 257/E21.238; 438/33, 68, 113, 114, 458, 438/460–465
See application file for complete search history.

(56) References Cited

U.S. PATENT DOCUMENTS

| | | |
|---|---|---|
| 5,850,088 A | 12/1998 | Aono |
| 6,091,113 A | 7/2000 | Tanaka |
| 6,399,400 B1 * | 6/2002 | Osann et al. ................... 438/14 |
| 7,239,163 B1 * | 7/2007 | Ralston-Good et al. .. 324/750.3 |
| 7,456,489 B2 * | 11/2008 | Scheucher .................... 257/618 |

(Continued)

FOREIGN PATENT DOCUMENTS

| | | |
|---|---|---|
| WO | 02/069389 A2 | 9/2002 |
| WO | 2004/042818 A1 | 5/2004 |

(Continued)

*Primary Examiner* — Cuong B Nguyen

(57) ABSTRACT

Integrated circuits (1) on a wafer comprise a wafer substrate (2) and a plurality of integrated circuits (Ia, Ib, Ic) formed on the wafer substrate (2). Each integrated circuit (Ia, Ib, Ic) comprises an electric circuit (24) and some of the integrated circuits (Ib, Ic) comprise, in addition to their electric circuits (24), process control modules (3) as integral parts. The process control modules (3) are employed during dicing and pick-and-place to align the dicing/pick-and-place devices.

15 Claims, 7 Drawing Sheets

(56) References Cited

U.S. PATENT DOCUMENTS

| | | |
|---|---|---|
| 2003/0017631 A1 | 1/2003 | Yamaguchi |
| 2004/0017013 A1 | 1/2004 | Yamaguchi |
| 2005/0023706 A1 | 2/2005 | Furuya et al. |
| 2005/0184362 A1* | 8/2005 | Fujita ............................ 257/620 |
| 2006/0012012 A1* | 1/2006 | Wang et al. ................... 257/620 |
| 2006/0219943 A1 | 10/2006 | Jean-Louis |
| 2007/0002964 A1 | 1/2007 | Xu |
| 2007/0029641 A1 | 2/2007 | Hamatani et al. |
| 2008/0290340 A1* | 11/2008 | West ............................... 257/48 |

FOREIGN PATENT DOCUMENTS

| | | | |
|---|---|---|---|
| WO | 2005/064408 A2 | 7/2005 | |
| WO | 2005/064678 A1 | 7/2005 | |
| WO | WO 2005064679 A1 * | 7/2005 | ........... H01L 23/544 |
| WO | 2005/117109 A1 | 12/2005 | |
| WO | 2005/117115 A1 | 12/2005 | |
| WO | 2006/013508 A1 | 2/2006 | |
| WO | 2006/024989 A2 | 3/2006 | |
| WO | 2006/132165 A | 12/2006 | |

* cited by examiner

INTEGRATED CIRCUITS ON A WAFER AND METHODS FOR MANUFACTURING INTEGRATED CIRCUITS

FIELD OF THE INVENTION

The invention relates to integrated circuits on a wafer and to methods for manufacturing integrated circuits.

BACKGROUND OF THE INVENTION

Integrated circuits are usually produced by forming a plurality of integrated circuits on a semiconductor wafer substrate by repeatedly exposing the wafer to a reticle mask utilizing a stepper, thereby forming a plurality of exposed areas arranged on the wafer surface. The image of the mask pattern is printed on a resist layer applied on the wafer surface and developed to form a resist pattern used as a mask for, for instance, etching a layer formed on the wafer surface. The integrated circuits are formed by repeating these processes. The individual integrated circuits are separated by saw lines used for a successive separation step.

In addition to the integrated circuits, test devices for measuring electric characteristics are also formed on the wafer substrate. The test devices are usually known as process control modules (PCM), may include active or passive electric devices, such as transistors or resistive tracks, and are usually located within the saw lines.

Published U.S. application for patent No. 2003/0017631 A1 discloses a reticle including a device pattern region, in which a plurality of mask patterns of semiconductor device chips is formed, and including a test element group (TEG) pattern region formed on one side of the device pattern region. The TEG pattern region is provided for arranging patterns of TEGs and alignment marks for the exposing apparatus. The lateral dimension of the TEG pattern region is the same as that of the device pattern region. The width, i.e. the vertical dimension, of the TEG pattern region corresponds to two rows of the semiconductor device chip patterns.

OBJECT AND SUMMARY OF THE INVENTION

It is an object of the present invention to provide integrated circuits on a wafer which allow to use the wafer surface, on which the integrated circuits are formed, to be used more efficiently.

The object is achieved in accordance with the invention by means of integrated circuits on a wafer, comprising a wafer substrate and a plurality of integrated circuits formed on the wafer substrate, wherein each integrated circuit comprises an electric circuit and some of the integrated circuits comprise, in addition to their electric circuits, process control modules as integral parts.

Integrated circuits are formed on the wafer substrate and comprise as integral parts electric circuits as it is generally known in the art. In order to test electric properties of the wafer substrate, there are normally process control modules provided. Process control modules, usually abbreviated as PCM, are known per se in the art. Process control modules are test devices for measuring electric characteristics of the wafer. Process control modules may include active or passive electric devices, such as transistors or resistive tracks. Conventional process control modules are formed within saw lines separating the individual integrated circuits and are not part of the individual integrated circuits. The inventive integrated circuits on the wafer, however, are designed such that some of the integrated circuits include as integral parts the process control modules. As a result, since the process control modules are not formed within the saw lines, the saw lines can be made relatively thin, allowing to use the surface of the wafer substrate, on which the integrated circuits are formed, more efficiently.

In addition, the process control modules of the inventive integrated circuits on the wafer are integrated in some of the individual integrated circuits, which means that when the integrated circuits on the wafer have been separated into individual integrated circuits during a separation step, some of the separated integrated circuits still include a process control module. Depending on the size of the integrated circuits, this also allows to use the aforementioned wafer substrate surface more efficiently, since no special area of the wafer substrate surface is dedicated to the process control modules.

The individual integrated circuits may be rectangular shaped as it is usual for integrated circuits. Then, the process control modules may be located at edges of the relevant integrated circuits. Locating the process control modules at the edges of the relevant integrated circuits can help to prevent that the process control modules do not or if at all only relatively little influence the performance of the electric circuits of the relevant integrated circuits.

Integrated circuits may comprise a seal ring surrounding their electric circuits. Seal rings may be made from metal, for instance, from gold and may be electrically contacted to the wafer substrate. In one embodiment of the inventive circuits on the wafer, each integrated circuit comprises a first seal ring surrounding its electric circuit and each of the integrated circuits including the process control modules comprises further a second seal ring surrounding its process control module. Using the two seal rings, each integrated circuit including its process control module may particularly designed such that the process control module is located on the edge of the integrated circuit, wherein the first seal ring surrounds a first rectangular area dedicated to the electric circuit and the second seal ring surrounds a second area, which is adjacent to the first area and borders the edge of the integrated circuit, for the process control module.

The integrated circuits without a process control module may comprise a third seal ring surrounding an area of the relevant integrated circuit, which area corresponds to the areas of the process control modules surrounded by the second seal rings. Then, each integrated circuit may comprise the first area, which is surrounded by the first seal ring and includes the electric circuit, and another seal ring, the second or third seal ring, respectively, being adjacent to the first seal ring and surrounding a further area. This further area is the aforementioned second area including a process control module if the relevant integrated circuit is an integrated circuit including a process control module. If the relevant integrated circuit does not include a process control module, then this area may particularly be free of any electric devices and may only comprise wafer substrate. As a result, the structure for the electric circuits and the size of each integrated circuit, regardless if the relevant integrated circuit does or does not include a process control module, is identical, within potential deviations resulting, for instance, from the manufacturing process.

The integrated circuits may particularly be formed on the wafer substrate utilizing a reticle. When manufacturing the integrated circuits on the wafer substrate, an area of the wafer substrate corresponding to the reticle is exposed and then the reticle is moved to a further area of the wafer substrate utilizing a stepper. The area exposed by the reticle is an exposure field. Each exposure field comprises rows and columns defined by first and second saw lines separating the integrated circuits. In order to align the reticle during manufacturing the integrated circuits on the wafer, each exposure field may comprise at least one optical control module formed on the wafer substrate. Optical control modules per se are well known in the art and are in this context alignment marks formed on the wafer substrate and used for automatically aligning the reticle during the process of manufacturing the integrated circuits on the wafer. Optical control modules may be comprised of square, rectangular or cross-shaped interference fields particularly automatically detectable by the stepper used for the reticle. Automatic alignment utilizing the optical control modules may be accomplished by passing low-energy laser beams through alignment marks on the reticle and reflecting them off corresponding alignment marks, i.e. the optical control modules, on the wafer substrate. An optical control module may particularly have a three dimensional structure such that is can be used for each exposure step during the manufacture of the integrated circuits on the wafer.

In one embodiment of the inventive integrated circuits on the wafer, some of the integrated circuits including the process control modules comprise also optical process control modules as integral parts. The optical control modules may particularly be integrated into the relevant integrated circuits such that the relevant optical control module is within the area surrounded by the respective second seal ring or is within the area surrounded by the respective first seal ring. Conventional optical control modules are formed within the saw lines. According to this variant of the inventive integrated circuits on the wafer, there may be three different integrated circuits, namely integrated circuits without any process and optical control modules, integrated circuits including process control modules, but not including optical control modules, and integrated circuits including process as well as optical control modules. The optical process controls modules may particularly be within the aforementioned second areas which are surrounded by the second seal rings and/or may be located at corners of the relevant integrated circuits.

The integrated circuits on the wafer may comprise first and second saw lines separating the integrated circuits, wherein the first saw lines run parallel and equidistant with respect to each other in a first direction defined by the rows, and the second saw lines run parallel and equidistant with respect to each other in a second direction defined by the columns, and a plurality of rectangular shaped exposure fields, each comprising rows and columns defined by the first and second saw lines. At least one of each of the two rows or the two columns located at the edges of the relevant exposure field may comprise at least one integrated circuit including process and optical control modules. Each exposure field is limited by two rows and by two columns at the four edges of the exposure field. The optical control modules needed for aligning the reticle during manufacturing of this variant of the inventive integrated circuits on the wafer are either located within these two rows, within these two columns, or within both, these two rows and two columns. This arrangement may help to better align the reticle.

In one embodiment of the inventive integrated circuits on the wafer, the optical control modules are adjacent to a respective first or second saw line bordering the relevant exposure field. Then, the optical control modules are located directly at the border of the exposure field, potentially helping to increase the accuracy of aligning the reticle.

When the inventive integrated circuits on the wafer are finished, they have to be separated into individual integrated circuits. This step is usually called die separation, wherein a separating device, such as a laser, is guided along the saw lines. Then, the integrated circuits on the wafer may be placed on a flexible foil and flexed to be separated along the saw lines. The inventive integrated circuits on the wafer can particularly be separated into individual integrated circuits according to the following steps:

providing the inventive integrated circuits on the wafer;
detecting the process control modules on the wafer substrate utilizing an alignment detecting device of a separating device;
aligning the separating device in response to the detected process control modules; and
guiding the separating device along the saw lines.

The structure of the process control modules is less complex than the structure of the electric circuits of the integrated circuits. Therefore, the process control modules can automatically be distinguished from the electric circuits of the integrated circuits and thus can be used for the alignment of the separating device.

The separating device may be guided along the bottom surface of the wafer substrate, i.e. along the surface opposite to the surface on which the integrated circuits are formed. Then, detecting the process control modules for the alignment of the separating device may include utilizing light shining through the bottom surface of the wafer substrate. Since the structure of the process control modules is less complex than the structure of the electric circuits of the integrated circuits, light shining through the bottom surface is less likely to be absorbed completely by the structure of the process control modules than by the structure of the electric circuits of the integrated circuits. Thus, it is likely that sufficient light is reflected by the structure of the process control modules, allowing utilizing the process control modules as alignment marks for the separating device.

Particularly when utilizing the laser, the integrated circuits on the wafer may be placed on a flexible film of a film frame carrier after. Then, the integrated circuits on the wafer, are flexed, utilizing, for instance, a bar. Due to the flexing, the integrated circuits on the wafer break along the saw lines.

The process control modules comprise test devices for measuring electric characteristics of the wafer, i.e. the process control modules comprise electric process control devices. These electric process control devices may be contacted by contact bumps which are, for instance, formed in recesses within a passivation layer covering the integrated circuits. Then, the contact bumps of the process control modules may be used for aligning the separating device. As mentioned above, the structure of the process control modules are less complex than the structure of the electric circuits of the integrated circuits. As a result, light shining through the bottom surface of the wafer substrate is likely be absorbed by the structure of the electric circuits preventing utilizing this part of the integrated circuits and particularly utilizing bumps for contacting the electric circuits for aligning the separating device. The structure of the process control modules, however, is less complex so that light shining through the bottom surface of the wafer substrate is less likely absorbed by the structure of the process control modules. This makes it possible that sufficient light may be reflected by the contact bumps of the process control modules, wherein the reflected light can be used for aligning the separating device.

Before separating the integrated circuits on the wafer into individual integrated circuits, the integrated circuits may be tested and registered as working and non-working integrated circuits. After the separation step, the individual integrated circuits may be placed on the foil of the film frame carrier. Then the working integrated circuits may be picked up from the film frame carrier utilizing a pick-and-place system, which may be aligned utilizing the process control modules.

The structure of the process control modules differs from the structure of the electric circuits so that the process control modules can be distinguished from the electric circuits. This allows utilizing the process control modules for aligning the pick-and-place system.

Particularly, the contact bumps configured to contact the electric process control devices of the process control modules may be used for aligning the pick-and-place system.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
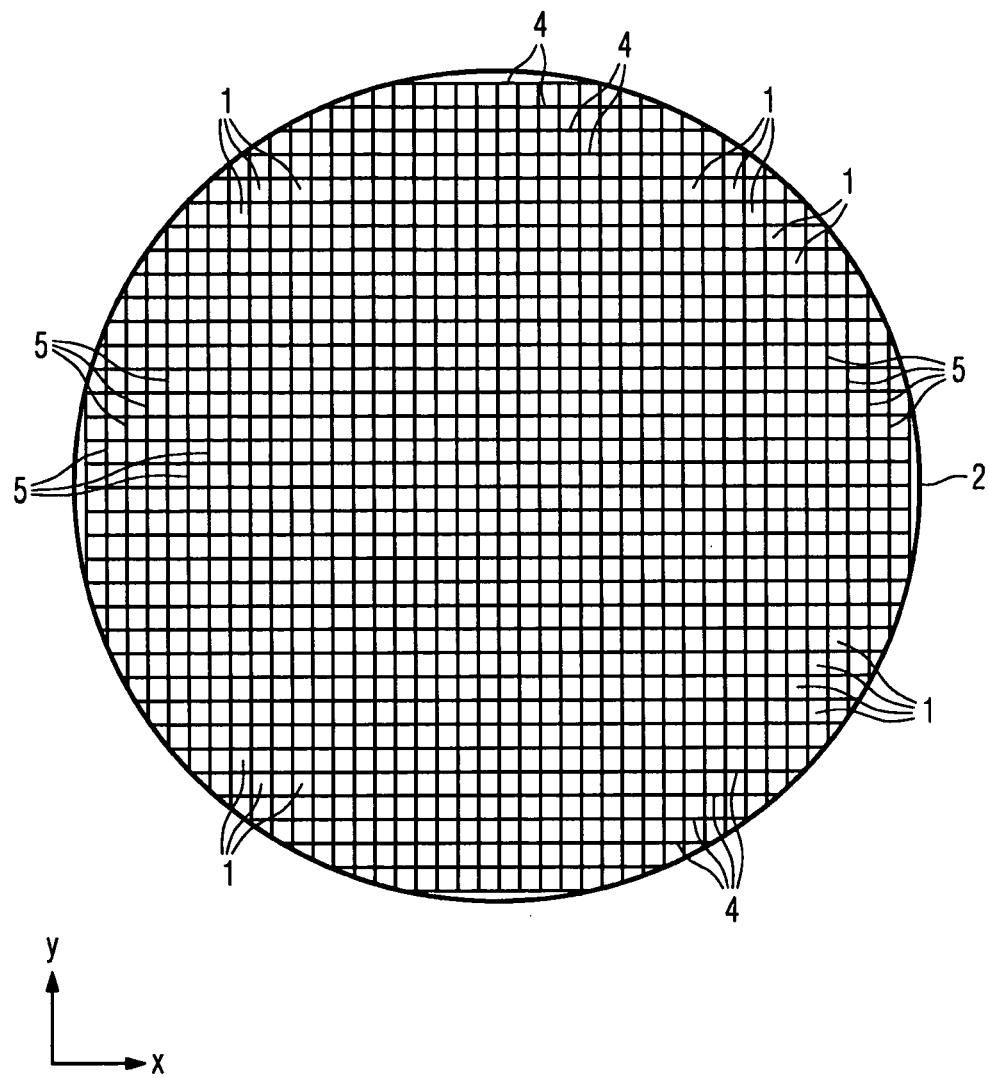
FIG. 1 is a top-view of a plurality of integrated circuits on a wafer.

FIG. 1 shows a top-view of integrated circuits 1 on a semiconductor wafer. The integrated circuits 1 may have been formed on a wafer substrate 2 as it will be explained below.

The integrated circuits 1 on the wafer substrate 2 are separated by first saw lines 4 running parallel in a first direction x and by second saw lines 5 running parallel in a second direction y. The first and second saw lines 4, 5 are each spaced apart such that two consecutive first saw lines 4 are equidistant and two consecutive second saw lines 5 are equidistant. Therefore, the integrated circuits 1 are formed on the wafer substrate 2 in rows running in the first direction x and columns running in the second direction y.

Figure 2:
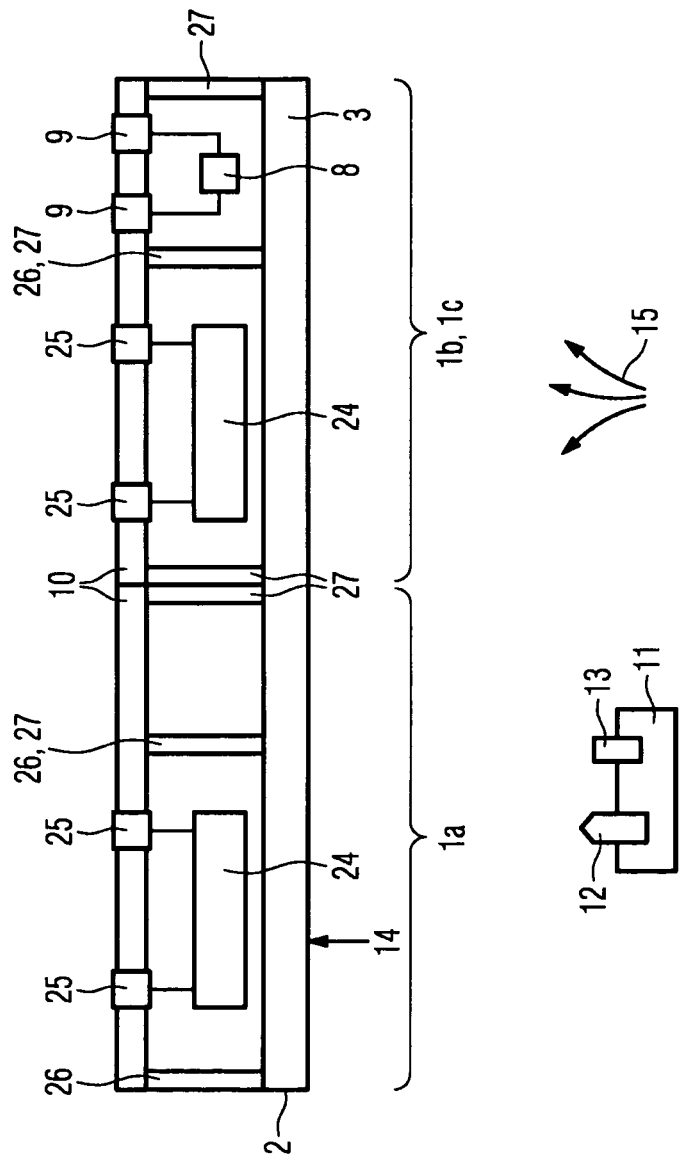
FIG. 2 is a part of a cross section of the integrated circuits on the wafer.
Figure 3:
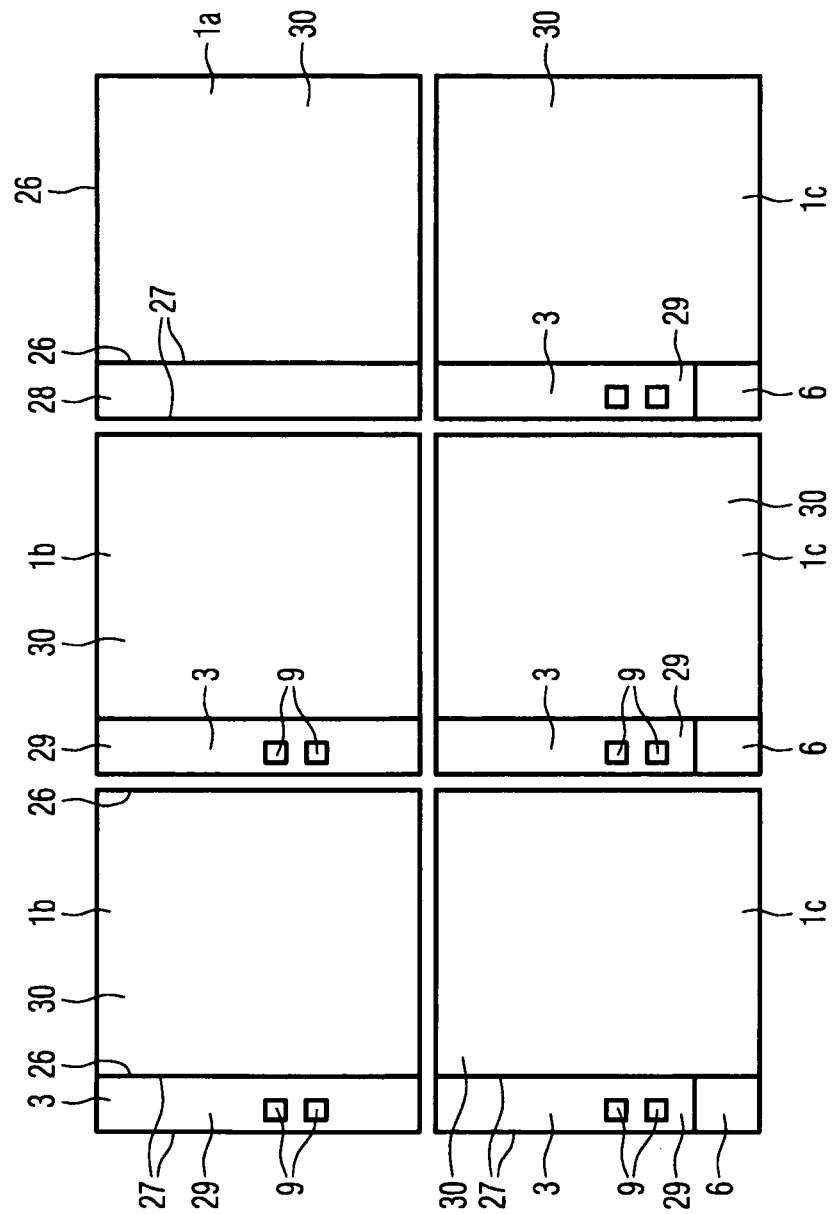
FIG. 3 is a detailed top-view of some of the integrated circuits on the wafer.

In addition to the integrated circuits 1, there are process control modules 3 and optical control modules 6 provided. For the exemplary embodiment, the process control modules 3 are integrated into some of the integrated circuits 1. These integrated circuits are denoted by the reference sign 1b. Additionally, some of the integrated circuits including a process control module 3 do also include one of the optical process control module 6. These integrated circuits are denoted by the reference signal 1c. Consequently, the integrated circuits 1 are comprised of integrated circuits 1a not including process or optical control modules 3, 6, integrated circuits 1b including process control modules 3, but no optical control modules 6, and integrated circuits 1c including process and optical control modules 3, 6. A cross section of an integrated circuit 1a not including any control module 3, 6 and an integrated circuit 1b, 1c including a process control module 3 is depicted in FIG. 2. FIG. 3 shows a detailed top-view of integrated circuits 1a, 1b, 1c.

Each integrated circuit 1 comprises an electric circuit 24 formed by its inner structure. The electric circuits 24 are connected to contact bumps 25, which may be made, for instance, from metal, particularly from gold. For the exemplary embodiment, the integrated circuits 1 are covered by a passivation layer 10. A passivation layer is a sealing layer added at the end of the fabrication process to prevent deterioration of electronic properties of the integrated circuits 1 through chemical action, corrosion, or handling during a packaging process. The passivation layer 10 may comprise silicon dioxide or silicon nitride and may protect against moisture or contamination.

The process control modules 3 are test devices for measuring electric characteristics of the wafer and may include active or passive electric devices, such as transistors or resistive tracks. Each process control module 3 comprises an electric process control device 8 which is connected to contact bumps 9 which may be made, for instance, from metal, particularly from gold. The contact bumps 9, 23 are formed into the passivation layer 10.

The optical control modules 6 are alignment marks formed on the wafer substrate 2 and into the integrated circuits 1c and used for automatically aligning a reticle during the process of manufacturing the integrated circuits 1 on the wafer for the exemplary embodiment. The optical control modules 6 may be comprised of square, rectangular or cross-shaped interference fields particularly automatically detectable by a stepper used for the reticle. Automatic alignment utilizing the optical control modules 6 may be accomplished by passing low-energy laser beams through alignment marks on the reticle and reflecting them off corresponding alignment marks, i.e. the optical control modules 6, on the wafer surface. The optical control modules 6 may particularly have a three dimensional structure such that they can be used for each exposure step during the manufacture of the integrated circuits 1 on the wafer substrate 2.

For the exemplary embodiment, each integrated circuit 1 includes a first seal ring 26 surrounding its electric circuit 24 and a second seal ring 27. The first and second seal rings 26, 27 are made from metal and are contacted to the wafer substrate 2. The second seal rings 27 surround the process control modules 3 or, in the case of the integrated circuits 1a not including process control modules 3, an area 28 corresponding to an area 29 which is dedicated to the process control modules 3. Therefore, each integrated circuit 1 comprises an area 30 surrounded by the first seal ring 26 and dedicated to the electric circuit 24. In addition, each integrated circuit 1 comprises the area 28 or 29 surrounded by the second seal ring 27. If the integrated circuit 1b, 1c comprises a process control module 3, then this area 29 is dedicated to the process control module 3. If the integrated circuit 1a does not comprise a process control module 3, then this area 28 is substantially void of any special structure and may only be comprised of unstructured semiconductor material.

For the exemplary embodiment, each integrated circuit 1 has a size of 1500 µm×1500 µm, wherein the area 30 dedicated to the electric circuits 24 has a size of 1420 µm×1500 µm and the areas 28, 29 have a size of 80 µm×1500 µm. The first and second saw line 4, 5 are 15 µm wide.

For the exemplary embodiment, the optical control modules 6 of the integrated circuits 1c are located within the area 29 surrounded by the second seal rings 27. Particularly, the optical control modules 6 are located in a corner of the integrated circuits 1c.

Figure 4:
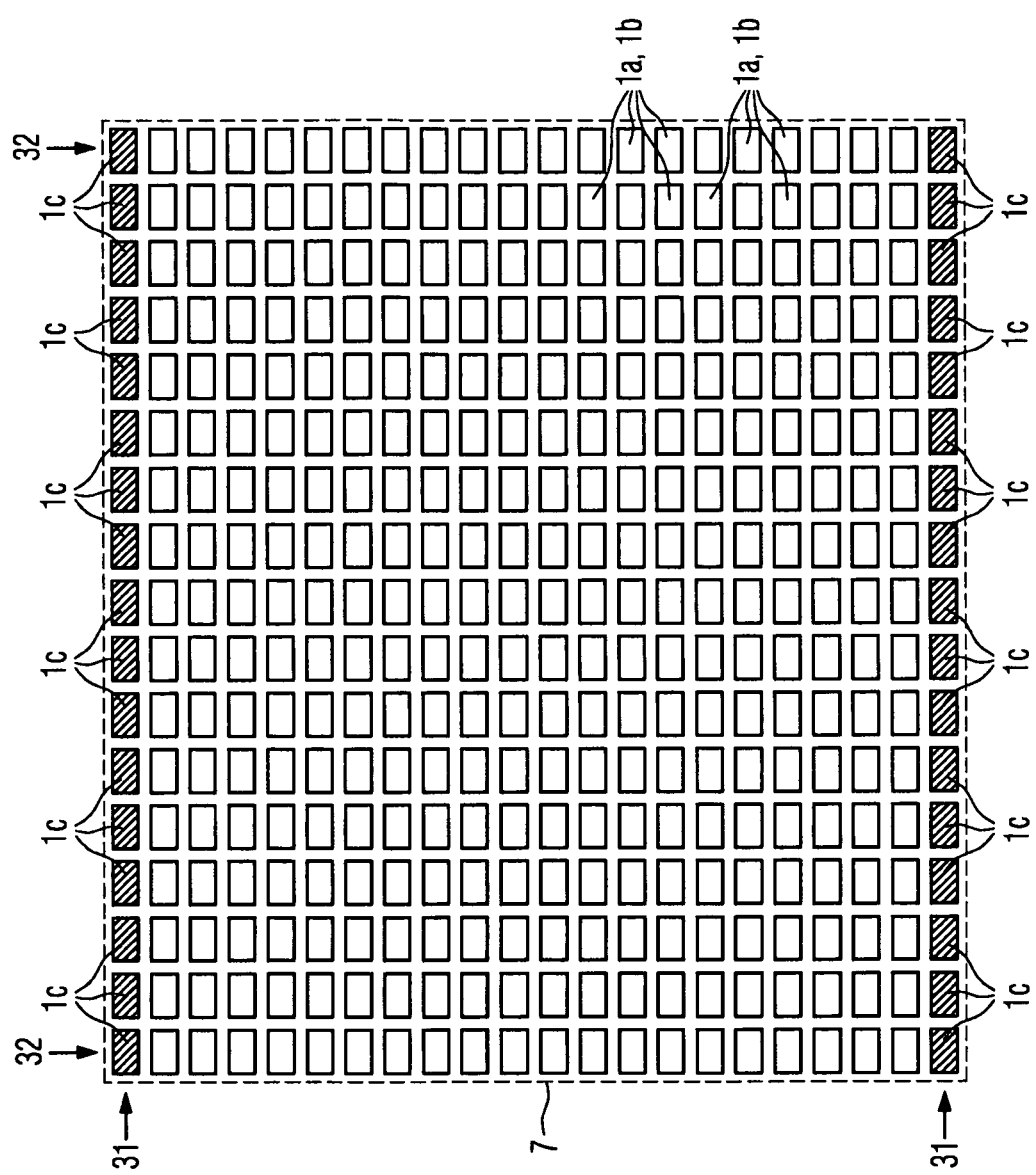
FIG. 4 is an exposure field.

Since for the exemplary embodiment the integrated circuits 1 have been formed on the wafer substrate 2 utilizing the reticle and the stepper, the wafer surface on which the integrated circuits 1 are formed is comprised of several exposure fields 7. FIG. 4 shows one of the exposure fields 7. During manufacturing of the integrated circuits 1 on the wafer substrate 2, an area of the wafer substrate 2 corresponding to the reticle is exposed and then the reticle is moved to a further area of the wafer substrate 2 utilizing the stepper. The area exposed by the reticle is one of the exposure fields 7.

For the exemplary embodiment, the wafer surface is comprised of several exposure fields 7. Each exposure field 7 comprises several rows and columns, and integrated circuits 1, and is bounded by two first and two second saw lines 4, 5. Next to each first saw line 4 limiting a relevant exposure field 7 runs an outer row 31 and next to each second saw line 5 limiting the relevant exposure field 7 runs an outer column 32. Both outer rows 31 are comprised of integrated circuits 1c including process and optical control modules 3, 6. Alternatively or additionally, the two outer columns 32 may be comprised of integrated circuits 1c including process and optical control modules 3, 6. Furthermore, the optical control modules 1c of the outer rows 31 are located such within the areas 29 that they are adjacent to the first saw lines 4 limiting the relevant exposure field 7. For instance, FIG. 3 shows three integrated circuits 1c whose optical control modules 6 are located in the left bottom corner. These integrated circuits 1c are those located within the bottom outer row 31 of the exposure field 7 depicted in FIG. 4. The optical control modules 6 of the integrated circuits 1c of the upper outer row 31 of the exposure field 7 of FIG. 4 may be located in the left upper corner of the relevant integrated circuits 1c.

When the fabrication of the integrated circuits 1 on the wafer is finished, the electric properties, i.e. the electric circuits 24 of the integrated circuits 1 are tested in a manner per se well known in the art and are registered in working and non-working integrated circuits 1. The registration in working and non-working integrated circuits may be performed utilizing an electronic map 21 corresponding to the matrix-arrangement of the integrated circuits 1 on the wafer, wherein working integrated circuits 1 may be labeled accordingly within the electronic map 21. For instance, working integrated circuits may be labeled by "1" and non-working integrated circuits may be labeled as "0".

Figure 5:
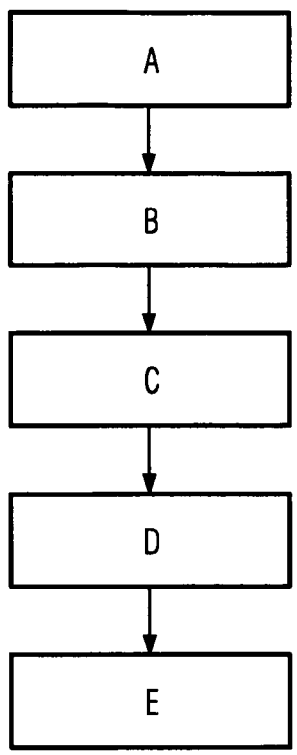
FIG. 5 is a flow chart.

After testing the integrated circuits 1 on the wafer, they will be separated. The separating may, for instance, be performed utilizing an appropriate saw or laser. For the exemplary embodiment, the separation step is carried out as following and is summarized by a flow chart shown in FIG. 5.

For the exemplary embodiment, the process control modules 3 and particularly the contact bumps 9 of the process control modules 3 are used for aligning a separating device 11 which may comprise a laser 12 which is going to be guided on a bottom wafer surface 14 of the wafer substrate 2 along the saw lines 4, 5. The bottom wafer surface 14 is opposite to the surface of the wafer substrate 2 on which the integrated circuits 1 are formed.

In order to be guided accurately along the saw lines 4, 5, the laser 12 is aligned with respect to the wafer substrate 2. For the alignment, the bottom wafer surface 14 is subjected to light 15 which is reflected by the contact bumps 9 of the process control modules 3. The reflected light is detected by an optical sensor 13 of the separating device 11, step A of the flow chart of FIG. 5. Thus, the optical sensor 13 detects the contact bumps 9 of the process control modules 3.

In response to the detected contact bumps 9, the laser 12 can be aligned with respect to the wafer substrate 2, step B of the flow chart.

Then, the aligned laser 12 is guided on the bottom surface 14 along the saw lines 4, 5, step C of the flow chart. After that, the integrated circuits 1 on the wafer are placed on a foil 16 of a film frame carrier 17 shown in FIG. 6. The foil 16 of the film frame carrier 17 is flexible, such that the wafer can be flexed in order to separate the individual integrated circuits 1 by breaking the wafer substrate 2 along the saw lines 4, 5. The wafer substrate 2 may be flexed by utilizing bars as it is per se known in the art, step D of the flow chart of FIG. 5.

After breaking the wafer substrate 2 along the saw lines 4, 5, the foil 16 of the film frame carrier 17 is slightly stretched in order to generate gaps 18 between adjacent separated integrated circuits 1, step E of the flow chart. FIG. 7 depicts a top-view and FIG. 6 a cross section of the separated integrated circuits 1 attached to the foil 16 of the film frame carrier 17.

Figure 6:
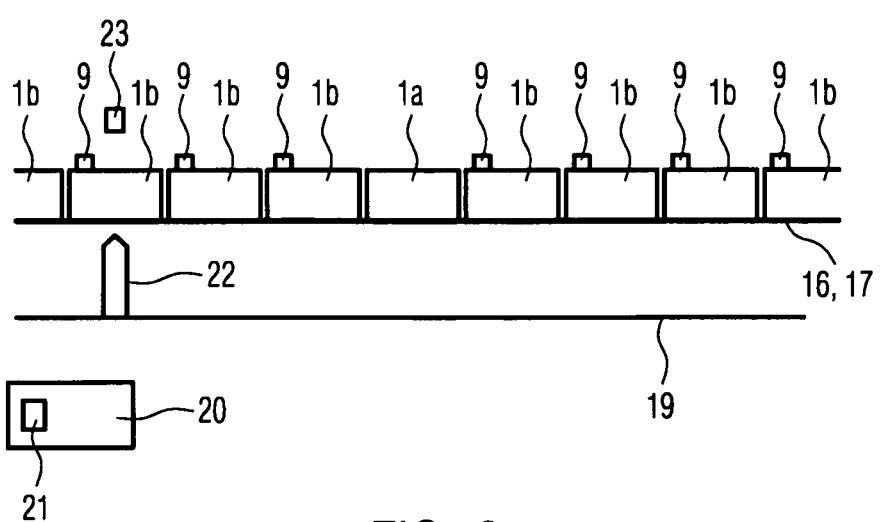
FIG. 6 is a pick-and-place system.
Figure 7:
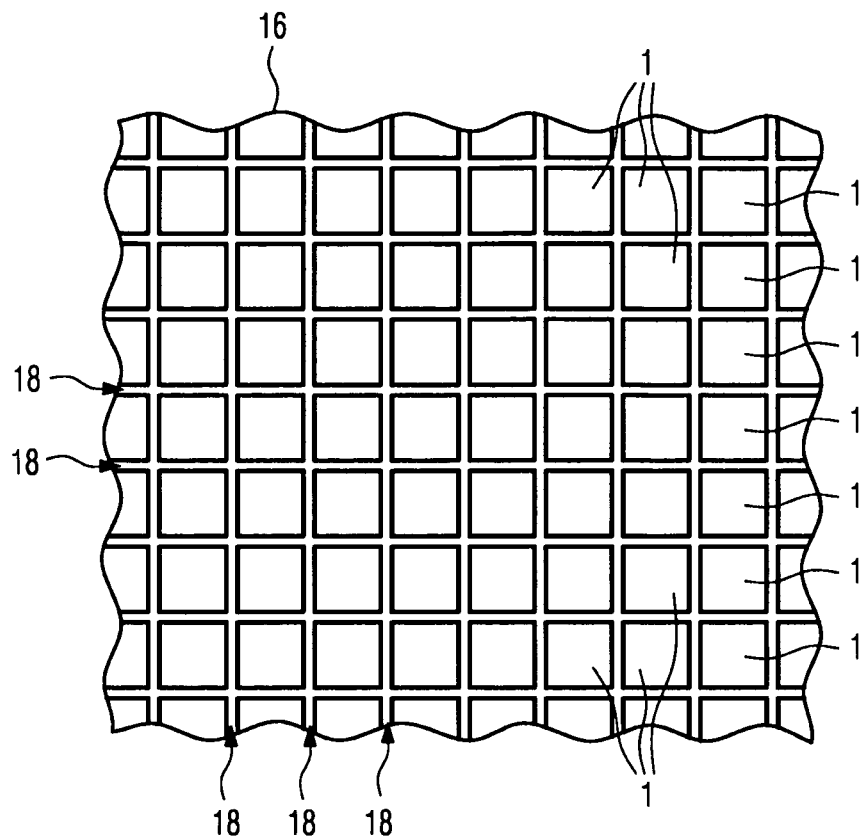
FIG. 7 is a top-view of some of the integrated circuits 1 on a foil of a film frame carrier.

After that, the separated and working integrated circuits 1 are picked up from the film frame carrier 17 utilizing a pick-and-place system 19 shown in FIG. 6.

For the exemplary embodiment, the pick-and-place system 19 is controlled by a computer 20 utilizing the electronic map 21 which indicates which of the integrated circuits 1 are working and which of the integrated circuits 1 are non-working integrated circuits 1. The pick-and-place system 19 comprises a needle 22 which, during the picking up of the working integrated circuits 1, is moved under the relevant integrated circuit 1 and moved up in order to slightly lift the relevant integrated circuit 1. The pick-and-place system 19 further comprises an optical sensor 23 which detects the contact bumps 9 of the process control modules 3. The optical sensor 23 may be mechanically coupled to the needle 22 such that the optical sensor 23 is above and the needle 22 is below an integrated circuit 1 to be picked up.

Figure 8:
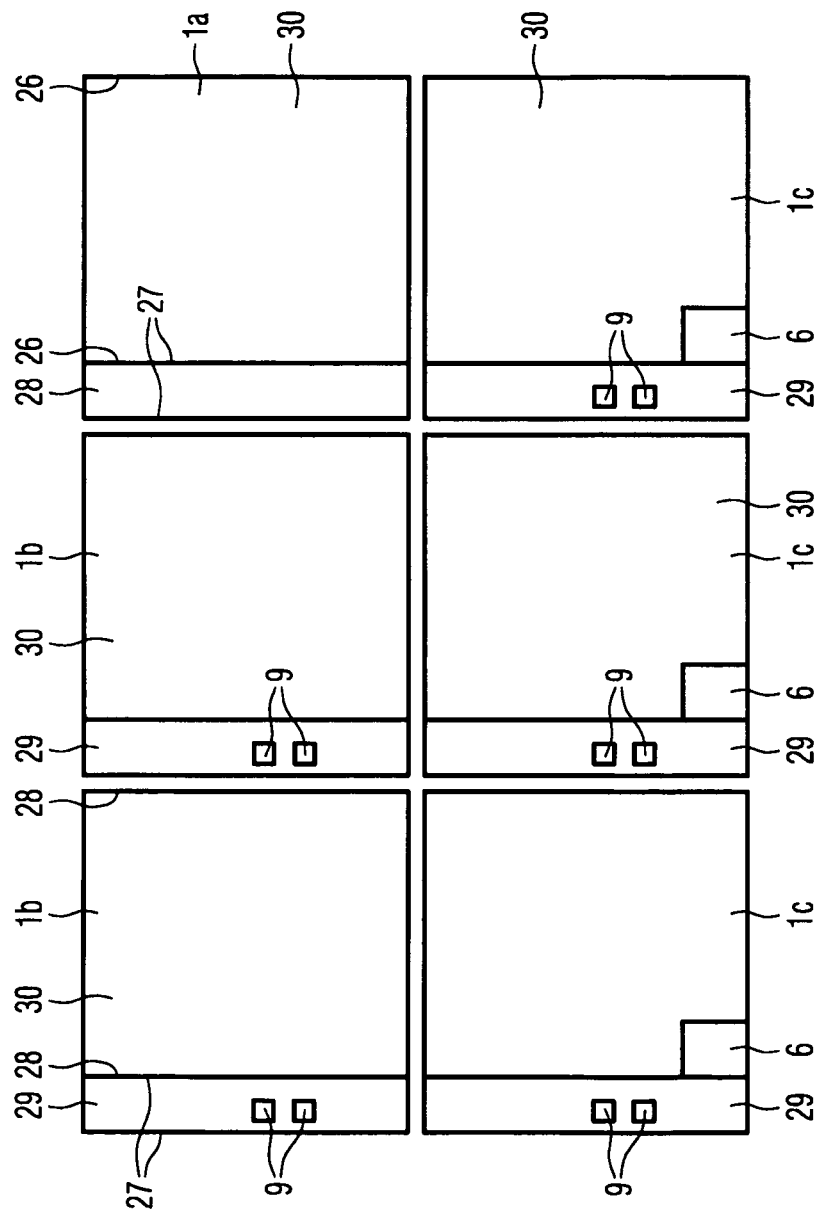
FIG. 8 is a detailed top-view of alternative integrated circuits on a wafer.

FIG. 8 shows a top-view of alternative integrated circuits 1 which may be used instead of the integrated circuits 1 described so far. The integrated circuits 1 of FIG. 8 differ mainly form the integrated circuits 1 described so far that the optical control modules 6 of the integrated circuits 1c are not located within the areas 29 surrounded by the second seal rings 27, but are located within the areas 30 surrounded by the first seal rings 26.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. An apparatus comprising
a wafer substrate; and
a plurality of integrated circuits formed on the wafer substrate and separated from one another by saw lines in the wafer and configured and arranged for separating the respective integrated circuits,
each integrated circuit having an electric circuit and a first seal ring surrounding the electric circuit, and
wherein at least a plurality but not all of the integrated circuits include
a process control module, configured and arranged to process characteristics of the apparatus, as an integral part of the integrated circuit and a second seal ring surrounding the process control module, and
an optical process control module as integral parts,
wherein the optical process control module in at least one of the plurality of the integrated circuits is surrounded by the first seal ring and not the second seal ring and, in another of the plurality of the integrated circuits, the optical process control module is surrounded by the second seal ring and not the first seal ring.

2. The apparatus of claim 1, further including contact bumps connected to the process control module, wherein the integrated circuits are rectangular shaped and each of the process control modules is located at an edge of the integrated circuit in which the process control module is located.

3. The apparatus of claim 1, wherein the optical process control module is integrated into an integrated circuit such that the optical process control module is within an area surrounded by the respective second seal ring or is within an area surrounded by the respective first seal ring.

4. The apparatus of claim 3, wherein the optical process control module is located at a corner of one of the integrated circuits.

5. The apparatus of claim 1,
wherein the saw lines include first and second saw lines separating the integrated circuits, the first saw lines running parallel and equidistant with respect to each other in a first direction defined by rows, and the second saw lines running parallel and equidistant with respect to each other in a second direction defined by columns; and
further including a plurality of rectangular shaped exposure fields, each comprising rows and columns defined by the first and second saw lines, wherein at least one of each of two rows or two columns located at edges of an exposure field comprises at least one integrated circuit.

6. The apparatus of claim 5, wherein the optical process control modules are adjacent to a respective first or second saw line bordering the exposure field.

7. The apparatus of claim 1, the first and second seal rings of each integrated circuit share a common conductive strip that borders a first region surrounded by the first seal ring and including the electric circuit, and that borders a second region surrounded by the second seal ring and including the process control module.

8. The apparatus of claim 1, wherein the process control modules are configured and arranged to provide electric characteristics of the wafer.

9. The apparatus of claim 8, wherein the first and second seal rings of each integrated circuit share a common conductive strip that borders both the first and second regions.

10. The apparatus of claim 1, wherein the process control module is configured and arranged to measure electronic characteristics of the wafer substrate, and wherein the process control module is connected to and includes contact bumps.

11. The apparatus of claim 1, wherein the process control module is configured and arranged to measure electronic characteristics of the wafer substrate and further including optical control modules configured and arranged to align a reticle for separation of the plurality of integrated circuits.

12. An apparatus comprising
a wafer substrate; and
a plurality of integrated circuits formed on the wafer substrate and separated from one another by saw lines in the wafer and configured and arranged for separating the respective integrated circuits, each integrated circuit having an electric circuit and a first seal ring surrounding the electric circuit, and wherein some of the integrated circuits further comprise a process control module as an integral part of the integrated circuit and a second seal ring surrounding the process control module, wherein
the integrated circuits are formed on respective region of the wafer substrate that are of the same size and shape, and each of the process control modules is formed in a commonly-located portion of the respective regions of the wafer substrate,
some of the integrated circuits do not include one of the process control modules, and
each of the integrated circuits that does not include one of the process control modules includes a third seal ring surrounding an area of the integrated circuit that corresponds to the commonly-located portion of the respective regions of the wafer substrate.

13. An apparatus comprising
a wafer substrate; and
a plurality of integrated circuits formed on the wafer substrate and separated from one another by saw lines in the wafer and configured and arranged for separating the respective integrated circuits, each integrated circuit having an electric circuit and a first seal ring surrounding the electric circuit, and wherein some of the integrated circuits further comprise a process control module as an integral part of the integrated circuit and a second seal ring surrounding the process control module, wherein
the integrated circuits are formed on respective region of the wafer substrate that are of the same size and shape, and each of the process control modules is farmed in a commonly-located portion of the respective regions of the wafer substrate, and wherein some of the integrated circuits do not include one of the process control modules.

14. The apparatus of claim 13, wherein each of the integrated circuits that does not include one of the process control modules includes a third seal ring.

15. The apparatus of claim 13, wherein each of the integrated circuits that does not include one of the process control modules includes a delineation article surrounding an area of the integrated circuit that corresponds to the commonly-located portion of the respective regions of the wafer substrate.

* * * * *